US009099960B2

(12) United States Patent
Jackson et al.

(10) Patent No.: US 9,099,960 B2
(45) Date of Patent: Aug. 4, 2015

(54) APPARATUS AND METHOD FOR PHASE LOCKED LOOP BANDWIDTH EXPANSION

(75) Inventors: Thomas Jackson, Monrovia, MD (US); George Eapen, Germantown, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 436 days.

(21) Appl. No.: 13/400,959

(22) Filed: Feb. 21, 2012

(65) Prior Publication Data

US 2013/0214830 A1    Aug. 22, 2013

(51) Int. Cl.
*H03L 7/08* (2006.01)
*H03C 3/08* (2006.01)
*H03C 3/09* (2006.01)

(52) U.S. Cl.
CPC ............... *H03C 3/08* (2013.01); *H03C 3/0908* (2013.01); *H03L 7/08* (2013.01)

(58) Field of Classification Search
USPC .......... 375/215, 294, 327, 373–376; 455/260; 708/300–323
See application file for complete search history.

(56) References Cited

U.S. PATENT DOCUMENTS

| | | | | |
|---|---|---|---|---|
| 4,755,773 A | * | 7/1988 | Ohmagari | 332/113 |
| 5,432,723 A | * | 7/1995 | Chen et al. | 708/300 |
| 6,008,703 A | * | 12/1999 | Perrott et al. | 332/100 |
| 6,097,765 A | * | 8/2000 | Corrigan et al. | 375/305 |
| 6,366,620 B1 | * | 4/2002 | Jackson et al. | 375/308 |
| 7,075,376 B1 | * | 7/2006 | Huff et al. | 331/23 |
| 7,502,602 B2 | * | 3/2009 | Wolf | 455/260 |
| 2004/0178859 A1 | * | 9/2004 | Fontaine et al. | 331/170 |
| 2005/0073369 A1 | * | 4/2005 | Balboni et al. | 331/16 |
| 2006/0055466 A1 | * | 3/2006 | Hirano et al. | 331/16 |
| 2006/0128300 A1 | * | 6/2006 | Coffin, III | 455/3.02 |

FOREIGN PATENT DOCUMENTS

| | | |
|---|---|---|
| EP | 1 583 224 | 10/2005 |
| WO | 99/14850 | 3/1999 |

OTHER PUBLICATIONS

Chi-Jui Chou et al., "FPGA Implementation of Digital Filters", ICSPAT '93, pp. 1-9, 1993.*
Altera Corporation, "Implementing High Performance DSP Functions in Stratix & Stratix GX Devices", S52007-1.1, Sep. 2004.*
Wikipedia.org, "Butterworth filter", retrieved from https://web.archive.org/web/20111218055053/http://en.wikipedia.org/wiki/Butterworth_filter, Dec. 2011.*
M. Mansuri and C-K.K. Yang, "Jitter optimization based on phase-locked loop design parameters," IEEE J. of Solid-State Circuits, vol. 37, No. 11, pp. 1375-1382, 2002.*
M. H. Perrott, "PLL Design using the PLL Design Assistant Program", Jul. 2008.*
Extended Search Report dated Jun. 20, 2013 issued in corresponding European Patent Application No. 13155847.0-1810.

* cited by examiner

*Primary Examiner* — Chuong D Ngo
*Assistant Examiner* — Matthew Sandifer
(74) *Attorney, Agent, or Firm* — K&L Gates LLP

(57) ABSTRACT

An apparatus for PLL bandwidth expansion including a compensation filter and a phase locked loop, where the compensation filter is programmed with a compensation function derived based on programmable coefficients and parameters of a transmitting device, a frequency response of the phase locked loop, and a wanted frequency response.

20 Claims, 5 Drawing Sheets

APPARATUS AND METHOD FOR PHASE LOCKED LOOP BANDWIDTH EXPANSION

BACKGROUND

Devices that transmit wireless signals, such as Very Small Aperture Terminals (VSATs) in satellite communication systems, and cellular devices, may transmit the wireless signals on phase modulated carriers. The fidelity of a phase modulated carrier which is passed through a phase locked loop may be degraded by the bandwidth of that phase locked loop. The phase locked loop may reduce the bandwidth of the transmitting device, resulting in poorer performance than could be achieved by the rest of the components in the signal path of the receiving device.

BRIEF SUMMARY

It is an object of the present invention to provide an apparatus and method for phase locked loop bandwidth expansion.

In accordance with an aspect of the present invention, an apparatus for PLL bandwidth expansion includes a compensation filter and a phase locked loop, where the compensation filter is programmed with a compensation function derived based on programmable coefficients and parameters of a transmitting device, a frequency response of the phase locked loop, and a wanted frequency response.

Additional objects, advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION

The limitation on bandwidth caused by the use of a phase locked loop in a transmitting device may be overcome by using a compensation filter in the signal path at the baseband modulator. The compensation filter may expand the bandwidth of the signal path, and thus eliminate the limitation imposed by the bandwidth of the phase locked loop.

Figure 1:
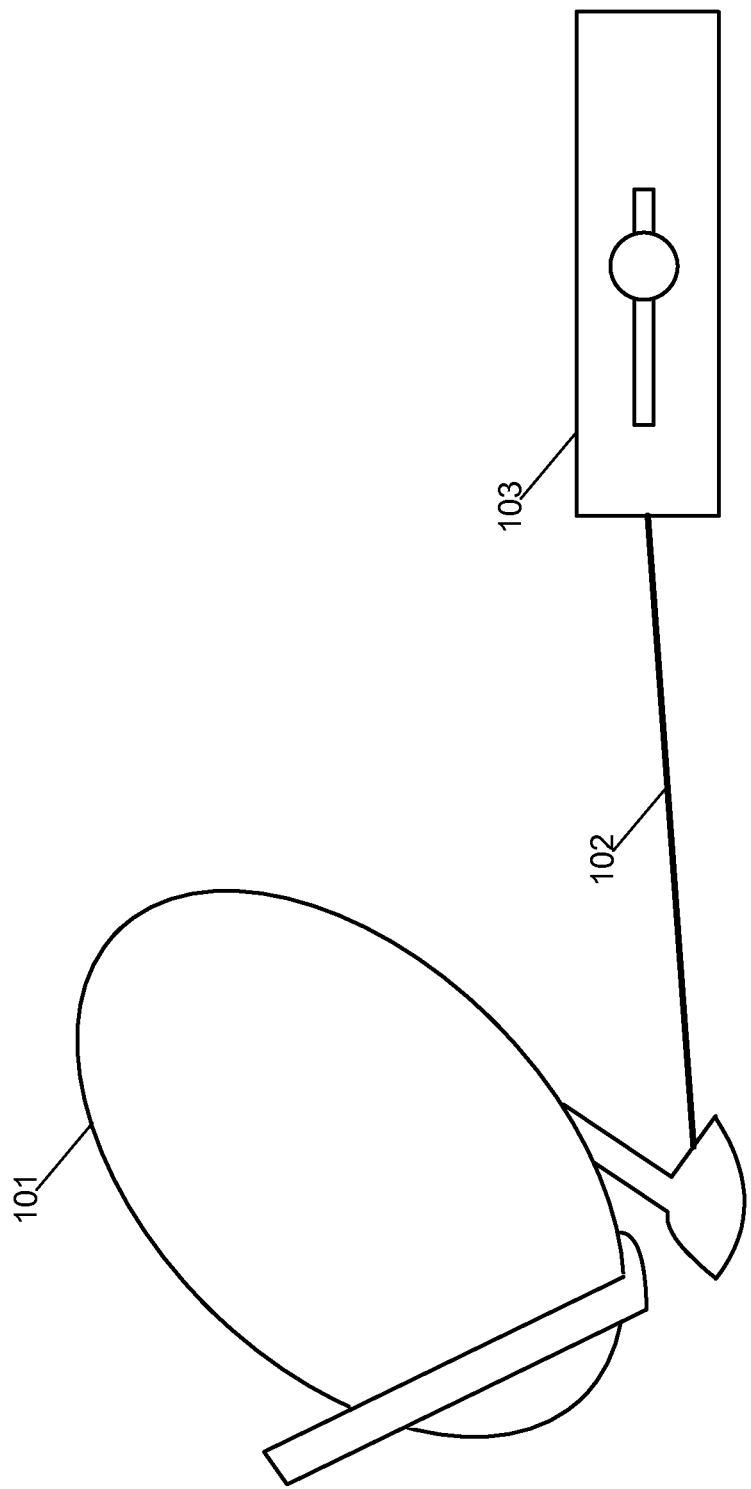
FIG. 1 depicts an exemplary VSAT with indoor unit (IDU) and outdoor unit (ODU)

The compensation filter may be implemented in a transmitting device, such as, for example, a VSAT. FIG. 1 depicts an exemplary VSAT with indoor unit (IDU) and outdoor unit (ODU). The ODU 101 may be, for example, a satellite dish in combination with electronics for signal processing. The IDU 103 may be a set top box including a receiver and a transmitter that may transmit a signal to the ODU 101 on a cable, such as the coaxial cable 102, so that the ODU 101 can transmit the signal to, for example, a satellite. The IDU 103 may perform processing on the wireless signal to be transmitted by the ODU 101, including, for example, inserting data into the signal. The signal may carry any suitable type of data, such as, for example, television data, or IP traffic. The ODU 101 may receive and process the signal from the IDU 103, and may transmit the signal as a wireless signal carried on a phase modulated carrier to a satellite, using, for example, a satellite dish.

Figure 2:
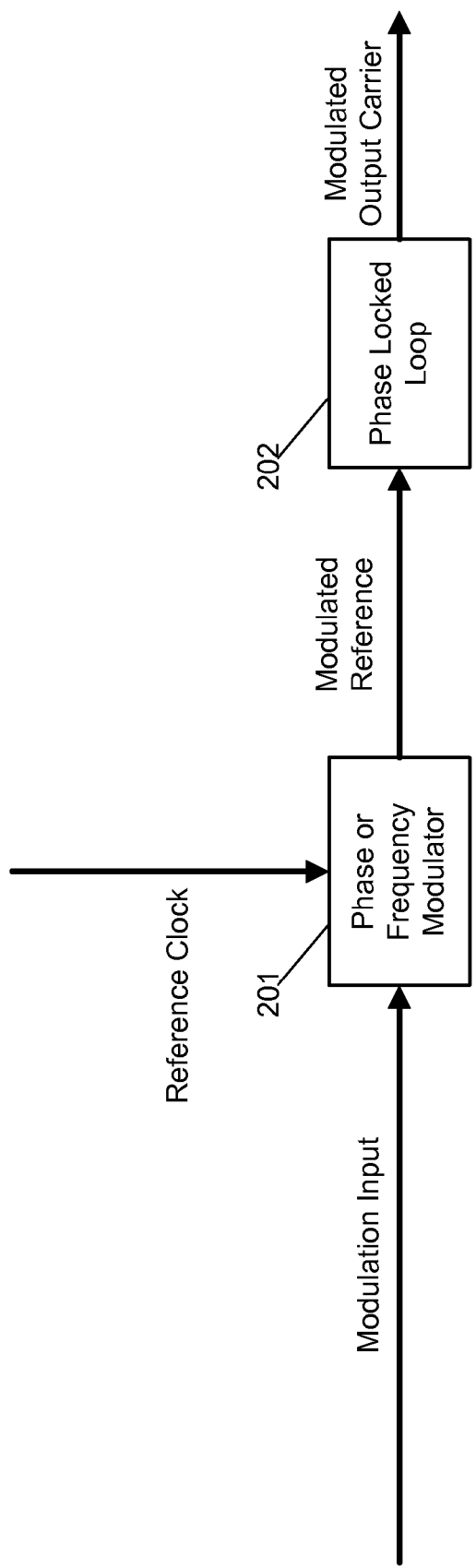
FIG. 2 depicts an exemplary signal path.

FIG. 2 depicts an exemplary signal path in a transmitting device. The signal path in the transmitting device, for example, in a VSAT, may be implemented with any suitable combination of hardware and software, including, for example, an application-specific integrated circuit (ASIC) or field programmable gate array (FPGA). The signal path may include a phase or frequency modulator 201 which may receive a reference signal which may then be modulated by an input data signal to produce a modulated signal, which may then be used as a modulated reference into a phase locked loop 202. The phase locked loop 202 may reside, for example, in the ODU 101 or the IDU 103 of a VSAT. The output of the phase locked loop 202 may be given by the transfer function:

$$PLL(s) = \frac{s \cdot x_1 + x_0}{s^5 + s^4 \cdot x_4 + s^3 \cdot x_3 + s^2 \cdot x_2 + s \cdot x_1 + x_0}, \text{ where}$$

$$x_0 = a \cdot K_\phi A \cdot b \cdot w_n^2 \cdot \frac{K_{vco}}{N},$$

$$x_1 = K_\phi A \cdot b \cdot w_n^2 \cdot \frac{K_{vco}}{N},$$

$$x_2 = w_n^2 \cdot b,$$

$$x_3 = w_n^2 + 2\xi \cdot w_n \cdot b,$$

$$x_4 = w_n^2 + 2\xi \cdot w_n \cdot b, \text{ and}$$

where s may be the Laplace transform operator (jw), and a, b, $K_{vco}$, $K_\phi$, N, A, $\xi$, $w_n$ may be programmable coefficients or parameters of the transmitting device, for example, of the ODU 101, and may be stored on the transmitting device at the time of manufacture. a may represent a "zero", b may represent a "pole", $K_{vco}$ may represent VCO gain, $K_\phi$ may represent phase detector gain, N may represent a variable divider value, A may represent a gain value, $\xi$ may represent a damping factor, and $w_n$, may represent a $2^{nd}$ order filter natural frequency. Exemplary values for the programmable coefficients may be A=0.53826, $K_{vco}=2\pi \cdot 375e^6$, $$K_\phi = \frac{2}{2\pi},$$

N=32, $\xi$=0.462, $w_n$=2$\pi$·15.65e$^6$ a=2$\pi$·37.7e$^3$, and b=2$\pi$·9.9e$^6$.

The magnitude response of the phase locked loop 202 may cause the phase locked loop 203 to act as a lowpass filter, with a passband limit less than some of the typical signals that may be received by the ODU 101. The lowpass property of the phase locked loop 202 may distort the transmitted signals heavily when signal bandwidth is wider than the filter bandwidth of the phase locked loop 202. This may result in the phase locked loop 202 limiting the overall bandwidth of the receiving device.

Figure 3:
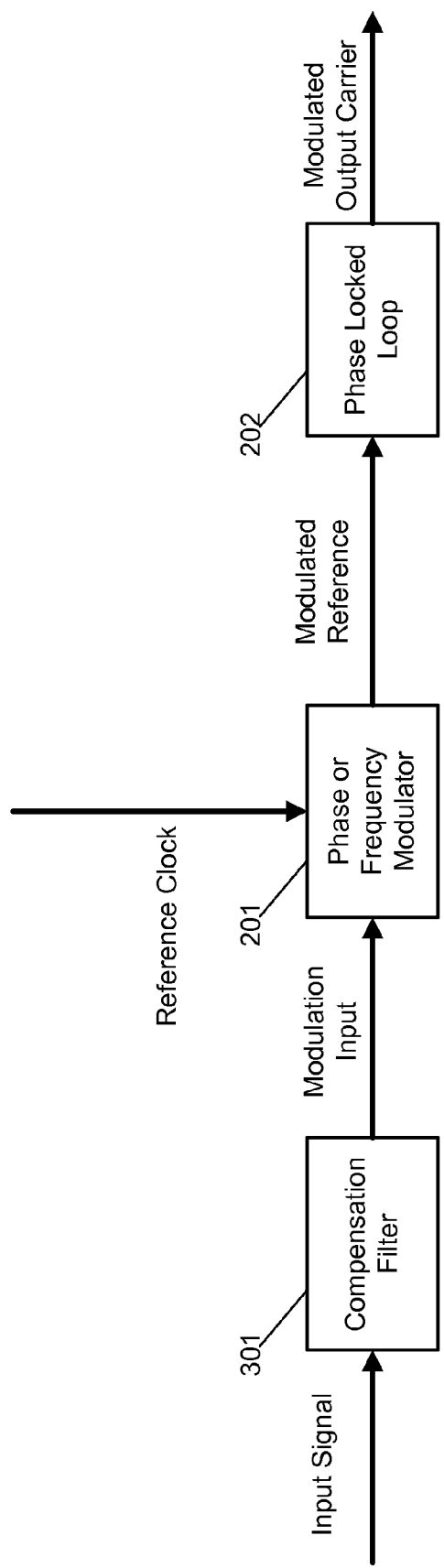
FIG. 3 depicts an exemplary signal path with a compensation filter.

A compensation filter 301 may be installed in the transmitting device in front of the phase locked loop 202 and the phase or frequency modulator 201. FIG. 3 depicts an exemplary signal path with a compensation filter. The compensation filter 301 may be a programmable hardware filter implemented in the ASIC or FPGA of, for example, the IDU 102.

The compensation filter 301 may pre-distort the transmitted signal, such that after low pass filter distortion by the phase locked loop 202, the transmitted signal at an antenna connector port of the ODU 101 preserves the original signal from the IDU 102 with less distortion. The combined filter response of the compensation filter 301 and the phase locked loop 202 to the baseband signal may be equivalent to a Butterworth filter or any other appropriate function.

The desired response of the combination of the compensation filter 301 and the phase locked loop 202, Freq(s), may be:

$$Freq(s) = \frac{wa^4}{s^4 + s^3 \cdot b_3 \cdot wa + s^2 \cdot b_2 \cdot wa^2 + s \cdot b_1 \cdot wa^3 + wa^4},$$

where wa may be the wanted bandwidth in radians/Hertz, and where, for a Butterworth response, $b_3$ may be 2.6, $b_2$ may be 3.4, and $b_1$ may be 2.6. By dividing the desired response by the response of the phase locked loop 202, the fifth order compensation function, Fcomp(s), for the compensation filter 301 may be derived as:

$$Fcomp(s) = \frac{y_0 \cdot (s^5 + s^4 \cdot x_4 + s^3 \cdot x_3 + s^2 \cdot x_2 + s \cdot x_1 + x_0)}{x_1 \cdot (s^5 + s^4 \cdot z_4 + s^3 \cdot z_3 + s^2 \cdot z_2 + s \cdot z_1 + z_0)},$$

where $y_0 = wa^4$, $y_1 = b_1 \cdot wa^3$, $y_2 = b_2 \cdot wa^2$, $y_3 = b_3 \cdot wa$, $z_0 = y_0 \cdot \frac{x_0}{x_1}$, $z_1 = y_0 + y_1 \cdot \frac{x_0}{x_1}$, $z_2 = y_1 + y_2 \cdot \frac{x_0}{x_1}$, $z_3 = y_2 + y_3 \cdot \frac{x_0}{x_1}$, and $z_4 = y_3 + \frac{x_0}{x_1}$.

To simplify implementation of the compensation filter 301, $w_n$ may be assumed to be very large, which may allow the $4^{th}$ and $5^{th}$ order terms to be ignored. The phase locked loop 202 frequency response may be approximated, for example, by:

$$PLL(s) = \frac{s \cdot c_1 + c_0}{s^3 \cdot s^2 \cdot c_2 + s \cdot c_1 + c_0}$$

where $c_0 = a \cdot K_\phi A \cdot K_{vco} \cdot \frac{b}{N}$ $c_1 = K_\phi A \cdot K_{vco} \cdot \frac{b}{N}$, and $c_2 = b$.

The desired second order frequency response, Freq(s), may be $$Freq(s) = \frac{wa^2}{s^2 + 2\xi \cdot wa \cdot s \cdot + wa^2},$$

where for a Butterworth response $\xi$ may be equal to 0.707. By dividing the desired response by the response of the phase locked loop 202, the third order compensation function, Fcomp(s), for the compensation filter 301 may be derived as:

$$Fcomp(s) = \frac{d_0 \cdot (s^3 + s^2 \cdot c_2 + s \cdot c_1 + c_0)}{c_1 \cdot (s^3 + s^2 \cdot \alpha_2 + s \cdot \alpha_1 + \alpha_0)},$$

where $d_0 = wa^2$ $c_0 = a \cdot K_\phi A \cdot b \cdot \frac{K_{vco}}{N}$, $c_1 = K_\phi A \cdot b \cdot \frac{K_{vco}}{N}$, $c_2 = b$, $\alpha_0 = a \cdot wa^2$, $\alpha_1 = wa^2 \cdot \sqrt{2} \cdot a \cdot wa$, and $\alpha_1 = \sqrt{2} \cdot wa + a$.

Figure 4:
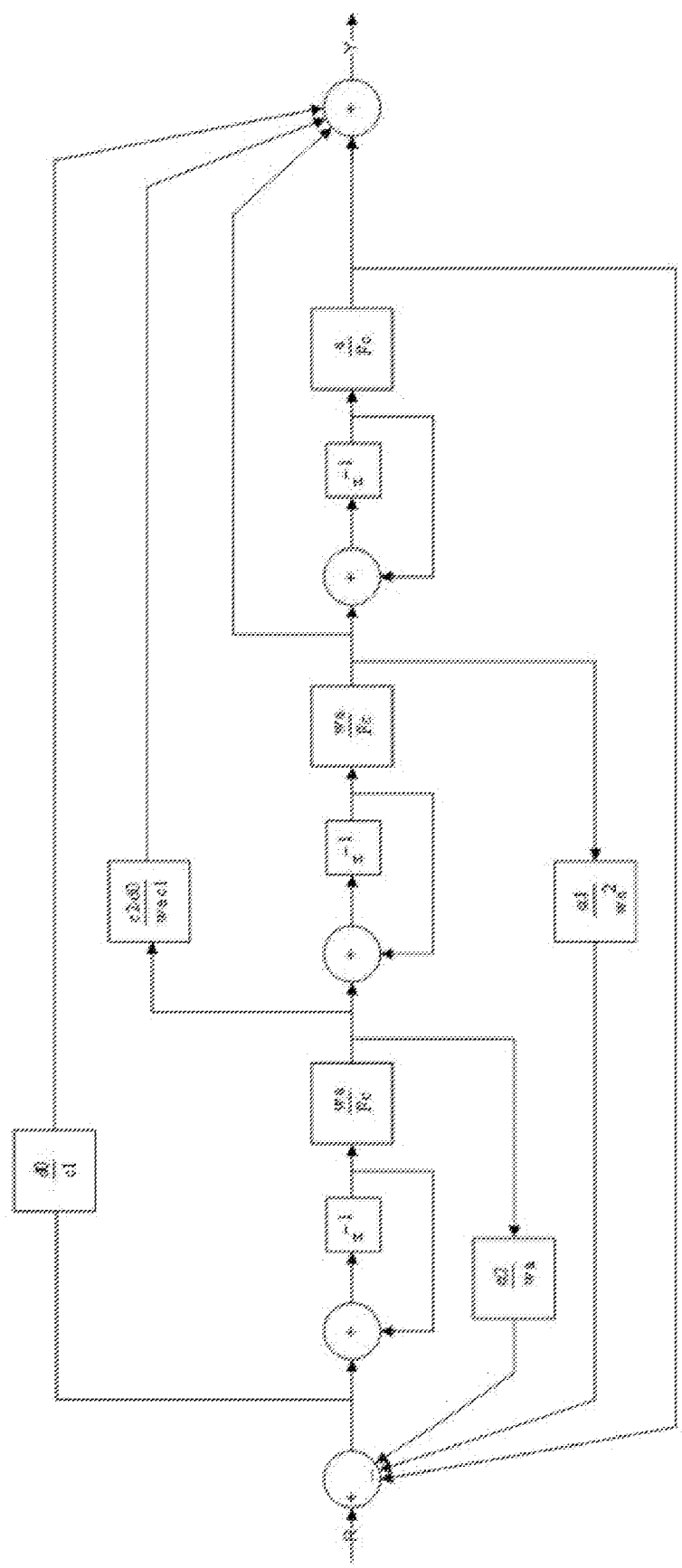
FIG. 4 depicts an exemplary digital state variable $3^{rd}$ order compensator for a compensation filter.

The analog filter described by the compensation function may be implemented in the compensation filter 301 using canonical state variable implementation, where Fc may be the sampling frequency of the compensation filter 301. FIG. 4 depicts an exemplary digital state variable $3^{rd}$ order compensator for a compensation filter. The filter coefficients may be calculated according to equations as show in FIG. 4, based on the values of the programmable coefficients or parameters of the transmitting device which may be stored in, for example, the ODU 101.

Figure 5:
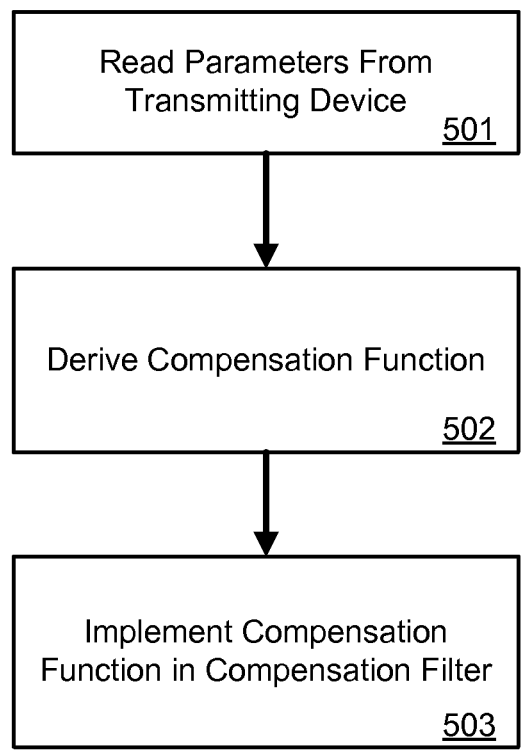
FIG. 5 depicts an exemplary procedure for installing the coefficients of a compensation filter.
Figure 4:
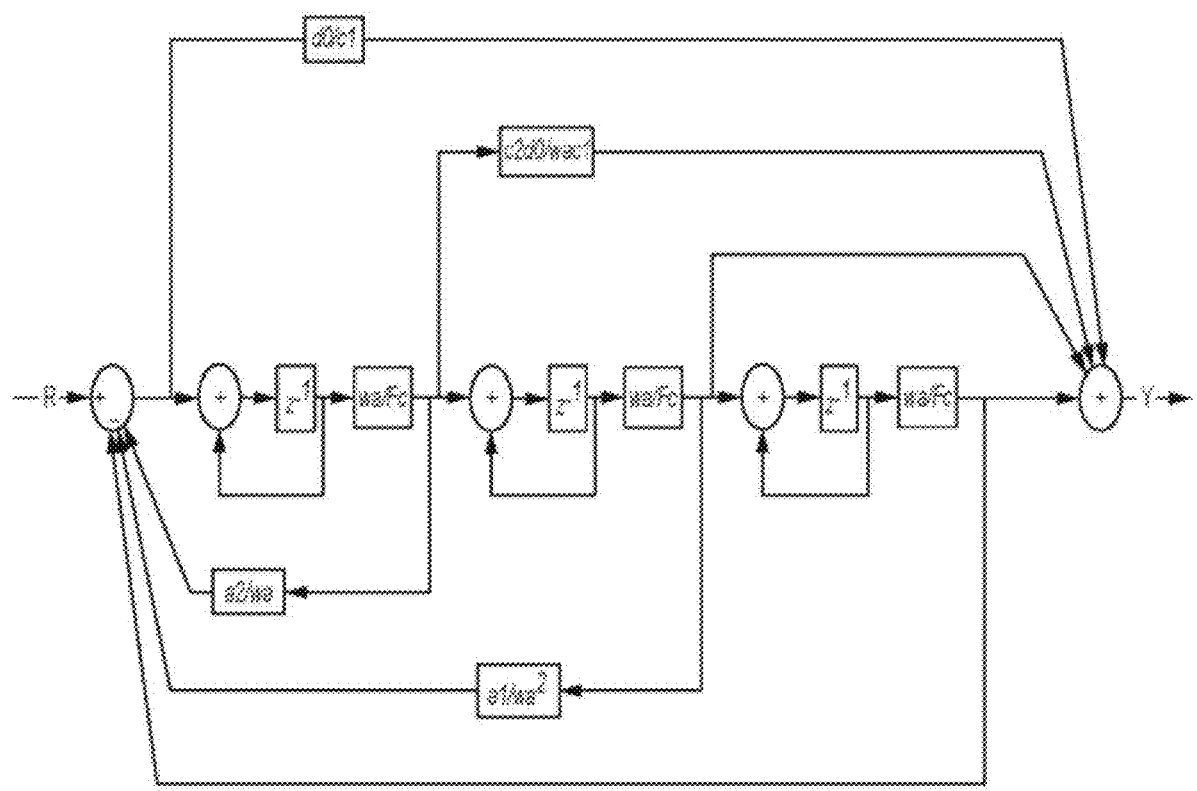

FIG. 5 depicts an exemplary procedure for installing a compensation filter. In block 501, parameters may be read from a transmitter. The compensation filter 301 may be installed in transmitting device, such as a VSAT. For example, the compensation filter 301 may be installed in the IDU 103 of a VSAT. When the IDU 103 is installed and connected to the ODU 101 of the VSAT, the programmable coefficients and parameters stored in the ODU 101 may be read by the IDU 103.

In block 502, a compensation function may be derived. For example, the compensation filter 301 may derive a compensation function, as described above, using the programmable coefficients and parameters. The compensation function may be, for, example, a $3^{rd}$ order compensation function derived based on a wanted frequency response and the frequency response of the phase locked loop 202.

In block 503, the derived compensation function may be implemented in the compensation filter. For example, the compensation function may be implemented in the compensation filter 301 by setting the filter coefficients in the compensation filter based on the compensation function derived using the programmable coefficients and parameters for the receiving device, such as the ODU 101 of the VSAT. The programming may occur in the hardware of the compensation filter 301.

As used herein, a "computer" or "computer system" may be, for example and without limitation, either alone or in combination, a personal computer (PC), server-based computer, main frame, server, microcomputer, minicomputer, laptop, personal data assistant (PDA), cellular phone, pager, processor, including wireless and/or wire line varieties thereof, and/or any other computerized device capable of configuration for receiving, storing and/or processing data for standalone application and/or over a networked medium or media. Examples of communication media that can be employed include, without limitation, wireless data networks, wire line networks, and/or a variety of networked media.

Computers and computer systems described herein may include operatively associated computer-readable media such as memory for storing software applications used in obtaining, processing, storing and/or communicating data. It can be appreciated that such memory can be internal, external, remote or local with respect to its operatively associated computer or computer system. Memory may also include any means for storing software or other instructions including, for example and without limitation, a hard disk, an optical disk, floppy disk, DVD, compact disc, memory stick, ROM (read only memory), RAM (random access memory), PROM (programmable ROM), EEPROM (extended erasable PROM), and/or other like computer-readable media.

In general, computer-readable media may include any medium capable of being a carrier for an electronic signal representative of data stored, communicated or processed in accordance with embodiments of the present invention. Where applicable, method steps described herein may be embodied or executed as instructions stored on a computer-readable medium or media.

It is to be understood that the figures and descriptions of the present invention have been simplified to illustrate elements that are relevant for a clear understanding of the present invention, while eliminating, for purposes of clarity, other elements. Those of ordinary skill in the art will recognize, however, that these and other elements may be desirable. However, because such elements are well known in the art, and because they do not facilitate a better understanding of the present invention, a discussion of such elements is not provided herein. It should be appreciated that the figures are presented for illustrative purposes and not as construction drawings. Omitted details and modifications or alternative embodiments are within the purview of persons of ordinary skill in the art.

It can be appreciated that, in certain aspects of the present invention, a single component may be replaced by multiple components, and multiple components may be replaced by a single component, to provide an element or structure or to perform a given function or functions. Except where such substitution would not be operative to practice certain embodiments of the present invention, such substitution is considered within the scope of the present invention.

The examples presented herein are intended to illustrate potential and specific implementations of the present invention. It can be appreciated that the examples are intended primarily for purposes of illustration of the invention for those skilled in the art. The diagrams depicted herein are provided by way of example. There may be variations to these diagrams or the operations described herein without departing from the spirit of the invention. For instance, in certain cases, method steps or operations may be performed or executed in differing order, or operations may be added, deleted or modified.

Furthermore, whereas particular embodiments of the invention have been described herein for the purpose of illustrating the invention and not for the purpose of limiting the same, it will be appreciated by those of ordinary skill in the art that numerous variations of the details, materials and arrangement of elements, steps, structures, and/or parts may be made within the principle and scope of the invention without departing from the invention as described in the following claims.

What is claimed is:

1. An apparatus for phase locked loop ("PLL") bandwidth expansion comprising:
    a transmitting device including a compensation filter and a PLL installed in front of the compensation filter, the compensation filter configured to be programmed with a compensation function having filter coefficients,
    wherein the filter coefficients are set from programmable coefficients and parameters of a transmitting device, and
    wherein a function of the compensation filter ("Fcomp(s)") is:

$$Fcomp(s) = \frac{d_0 * (s^3 + s^2 * c_2 + s * c_1 + c_0)}{c_1 * (s^3 + s^2 * a_2 + s * a_1 + a_0)}$$

where $$d_0 = wa^2$$

$$c_0 = a * K_\phi * A * b * \frac{K_{vco}}{N}$$

$$c_1 = K_\phi * A * b * \frac{K_{vco}}{N}$$

$$c_2 = b$$

$$a_0 = a * wa^2$$

$$a_1 = wa^2 * \sqrt{2} * a * wa$$

$$a_2 = \sqrt{2} * wa + a$$

and where s is a Laplace transform operator (jw), $d_0$, $C_0$, $c_1$, $c_2$, $a_0$, $a_1$, and $a_2$ are the filter coefficients, and $K_\phi$, $K_{VCO}$, A, N, a, b, w, wa, and $\xi$ are the programmable coefficients and parameters such that $K_\phi$ includes phase detector gain, $K_{VCO}$ includes voltage controlled oscillator gain, A includes a gain value, N includes a variable divider value, a includes a 'zero', b includes a 'pole', w includes a filter natural frequency, wa is a desired bandwidth, and includes a damping factor, and
wherein a frequency response of the PLL combined with the compensation filter ("Freq(s)") is:

$$Freq(s) = \frac{wa^2}{s^2 + 2\xi * wa * s + wa^2}.$$

2. The apparatus of claim 1, wherein the derivation of the compensation function is also based on a frequency response of the PLL and a wanted frequency response.

3. The apparatus of claim 1, wherein the compensation filter is programmed with the compensation function by programming the filter coefficients of a digital state variable $3^{rd}$ order or higher compensator.

4. The apparatus of claim 1, wherein the compensation filter is one of: an application specific integrated circuit, a field programmable gate array, and a combination of an application specific integrated circuit and a field programmable gate array.

5. The apparatus of claim 1, wherein the transmitting device is a VSAT.

6. The apparatus of claim 1, wherein the compensation filter is programmed with the compensation function by programming the filter coefficients of a filter comprising a filter topology.

7. The apparatus of claim 1, wherein the programmable coefficients and parameters include a zero of the PLL, a pole of the PLL, a voltage-controlled oscillator gain, a phase detector gain, a variable divider value, and a damping factor.

8. An apparatus for phase locked loop ("PLL") bandwidth expansion comprising:
   a compensation filter; and
   a PLL installed in front of the compensation filter,
   wherein the compensation filter is programmed with a compensation function having filter coefficients that are set from programmable coefficients and parameters of a transmitting device, a frequency response of the PLL, and a wanted frequency response, and
   wherein the compensation function ("Fcomp(s)") is:

$$Fcomp(s) = \frac{d_0 * (s^3 + s^2 * c_2 + s * c_1 + c_0)}{c_1 * (s^3 + s^2 * a_2 + s * a_1 + a_0)}$$

where $$d_0 = wa^2$$

$$c_0 = a * K_\phi * A * b * \frac{K_{vco}}{N}$$

$$c_1 = K_\phi * A * b * \frac{K_{vco}}{N}$$

$$c_2 = b$$

$$a_0 = a * wa^2$$

$$a_1 = wa^2 * \sqrt{2} * a * wa$$

$$a_2 = \sqrt{2} * wa + a$$

and where s is a Laplace transform operator (jw), $d_0$, $C_0$, $c_1$, $c_2$, $a_0$, $a_1$, and $a_2$ are the filter coefficients, and $K_\phi$, $K_{VCO}$, A, N, a, b, w, wa, and $\xi$ are the programmable coefficients and parameters such that $K_\phi$ includes phase detector gain, $K_{VCO}$, includes voltage controlled oscillator gain, A includes a gain value, N includes a variable divider value, a includes a 'zero', b includes a 'pole', w includes a filter natural frequency, wa is a desired bandwidth, and includes a damping factor, and
   wherein a frequency response of the PLL combined with the compensation filter ("Freq(s)")is:

$$Freq(s) = \frac{wa^2}{s^2 + 2\xi * wa * s + wa^2}.$$

9. The apparatus of claim 8, wherein the compensation function is a function for the wanted frequency response divided by a function for the frequency response of the PLL.

10. The apparatus of claim 8, wherein the compensation function includes one of: a $5^{th}$ order function, a $4^{th}$ order function, and a $3^{rd}$ order function.

11. The apparatus of claim 8, wherein the compensation filter and the PLL in combination produce a Butterworth response.

12. The apparatus of claim 8, wherein the transmitting device is a VSAT, and wherein the programmable coefficients and parameters are stored in an outdoor unit of the VSAT.

13. The apparatus of claim 8, wherein the compensation filter is programmed with the compensation function by programming the filter coefficients of digital state variable $3^{rd}$ order or higher compensator.

14. A method for phase locked loop ("PLL") bandwidth expansion comprising:
   determining, via a processor, programmable coefficients and parameters;
   deriving, via the processor, a compensation function including filtering coefficients based on the programmable coefficients and parameters;
   determining, via the processor, a function for a frequency response of a PLL installed in front of a compensation filter that includes the compensation function; and
   implementing, via the processor, the compensation function of the compensation filter within the transmitting device,
   wherein the compensation function ("Fcomp(s)") is:

$$Fcomp(s) = \frac{d_0 * (s^3 + s^2 * c_2 + s * c_1 + c_0)}{c_1 * (s^3 + s^2 * a_2 + s * a_1 + a_0)}$$

where $$d_0 = wa^2$$

$$c_0 = a * K_\phi * A * b * \frac{K_{vco}}{N}$$

$$c_1 = K_\phi * A * b * \frac{K_{vco}}{N}$$

$$c_2 = b$$

$$a_0 = a * wa^2$$

$$a_1 = wa^2 * \sqrt{2} * a * wa$$

$$a_2 = \sqrt{2} * wa + a$$

and where s is a Laplace transform operator (jw), $d_0$, $C_0$, $c_1$, $c_2$, $a_0$, $a_1$, and $a_2$ are the filter coefficients, and $K_\phi$, $K_{VCO}$, A, N, a, b, w, wa, and $\xi$ are the programmable coefficients and parameters such that $K_\phi$ includes phase detector gain, $K_{VCO}$, includes voltage controlled oscillator gain, A includes a gain value, N includes a variable divider value, a includes a 'zero', b includes a 'pole', w includes a filter natural frequency, wa is a desired bandwidth, and includes a damping factor, and
   wherein a frequency response of the PLL combined with the compensation filter ("Freq(s)") is:

$$Freq(s) = \frac{wa^2}{s^2 + 2\xi * wa * s + wa^2}.$$

15. The method of claim 14, further comprising reading the programmable coefficients and parameters stored on the transmitting device.

16. The method of claim 14, wherein deriving the compensation function based on the programmable coefficients and parameters further comprises:
   determining, via the processor, a function for a wanted frequency response; and
   dividing, via the processor, the function for the wanted frequency response by the function for the frequency response of the PLL.

17. The method of claim 14, wherein the compensation function includes one of: a $5^{th}$ order function, a $4^{th}$ order function, and a $3^{rd}$ order function.

18. The method of claim 14, wherein implementing the compensation function further comprises programming the filter coefficients of a digital state variable $3^{rd}$ order or higher compensator.

19. The method of claim 18, wherein the digital state variable $3^{rd}$ order compensator is implemented in a field programmable gate array.

20. The method of claim 18, wherein the digital state variable $3^{rd}$ order compensator is implemented in an application specific integrated circuit.

* * * * *

UNITED STATES PATENT AND TRADEMARK OFFICE
CERTIFICATE OF CORRECTION

PATENT NO.       : 9,099,960 B2
APPLICATION NO.  : 13/400959
DATED            : August 4, 2015
INVENTOR(S)      : Jackson et al.

Page 1 of 2

It is certified that error appears in the above-identified patent and that said Letters Patent is hereby corrected as shown below:

In the Drawings:

Please replace Figure 4 with the attached.

In the Claims:

In column 6, line 37 (Claim 1), please replace "$C_o$" with --$c_o$--.

In column 6, line 38 (Claim 1), please replace "$K_{VCO}$" with --$K_{vco}$--.

In column 6, line 41 (Claim 1), please replace "$K_{VCO}$" with --$K_{vco}$--.

In column 6, line 45 (Claim 1), please replace "and includes" with --and $\xi$ includes--.

In column 7, line 39 (Claim 8), please replace "$C_o$" with --$c_o$--.

In column 7, line 40 (Claim 8), please replace "$K_{VCO}$" with --$K_{vco}$--.

In column 7, line 43 (Claim 8), please replace "$K_{VCO}$" with --$K_{vco}$--.

In column 7, line 47 (Claim 8), please replace "and includes" with --and $\xi$ includes--.

In column 8, line 40 (Claim 14), please replace "$C_o$" with --$c_o$--.

In column 8, line 41 (Claim 14), please replace "$K_{VCO}$" with --$K_{vco}$--.

In column 8, line 44 (Claim 14), please replace "$K_{VCO}$" with --$K_{vco}$--.

In column 8, line 48 (Claim 14), please replace "and includes" with --and $\xi$ includes--.

Signed and Sealed this
Nineteenth Day of July, 2016

Michelle K. Lee
*Director of the United States Patent and Trademark Office*